United States Patent [19]

Price et al.

[11] 4,081,756
[45] Mar. 28, 1978

[54] DUAL CHANNEL SIGNAL DETECTOR CIRCUIT

[75] Inventors: Robert Price, Lexington, Mass.; George V. Jacoby, Los Altos; Arthur P. Geffon, Sunnyvale, both of Calif.

[73] Assignee: Sperry Rand Corporation, New York, N.Y.

[21] Appl. No.: 755,875

[22] Filed: Dec. 30, 1976

[51] Int. Cl.² .......... H03K 5/20; H03K 5/153
[52] U.S. Cl. .......... 328/117; 307/232; 307/351; 307/360; 328/165; 360/45; 360/53; 360/65
[58] Field of Search .......... 307/351, 354, 360, 362, 307/231, 232; 328/110, 114–117, 119, 167, 165; 360/53, 45, 65, 42

[56] References Cited

U.S. PATENT DOCUMENTS

| 3,505,537 | 4/1970 | Giordano | 307/362 |
| 3,524,994 | 8/1970 | Ritter | 307/351 |
| 3,760,282 | 9/1973 | Arnold et al. | 307/351 X |

Primary Examiner—John Zazworsky
Attorney, Agent, or Firm—Eugene T. Battjer; William E. Cleaver; Marshall M. Truex

[57] ABSTRACT

A dual channel signal detector circuit comprising an equalizer for responding to a variable peak amplitude input signal, in which the peaks are representative of data, so as to provide a substantially constant peak amplitude output signal having discrete data representative pulses spaced along a base line, which is substantially flat at the zero level in regions intermediate the pulses, for application to separate peak detection and amplitude detection channels. The peak detection channel produces data pulses each indicative of the relative time occurrence of the peak of a respective data representative pulse while the amplitude detection channel is triggered by signal levels of the data representative pulses exceeding a predetermined threshold to produce gating pulses for gating the data pulses to the circuit output substantially exclusive of any noise that may be present at the input of the circuit.

21 Claims, 14 Drawing Figures

ISOLATED PULSE BEFORE EQUALIZATION

ISOLATED PULSE AFTER EQUALIZATION

DUAL CHANNEL SIGNAL DETECTOR CIRCUIT

BACKGROUND OF THE INVENTION

1. Field of Invention

This invention relates to dual channel type signal detector circuits and more specifically to improvements therein for achieving more accurate and reliable signal detection. The invention is considered useful for various signal detection applications and particularly desirable for use in digital magnetic data read systems with reference to which it is explained herein.

2. Description of Prior Art

Magnetic recording of binary digital data is customarily performed by effecting polarization changes or transitions in a magnetic storage medium. One of the primary objectives in such data storage is to increase the data packing density, that is the number of information bits recorded per unit length of the storage medium. To achieve this objective, magnetic recording of the data is generally carried out by means of various encoding techniques that have been developed for the purpose of reducing the number of transitions per bit, or per group of bits, while simultaneously assuring that the maximum interval between transitions remains short enough so that a self-clocking capability can be maintained for recovery of the data when reading from the storage medium. Nevertheless, if the transitions become too closely spaced as a consequence of unduly high packing density, so-called pulse crowding occurs because of inherent features of the magnetic recording and reading process. Pulse crowding is manifested in the course of reading from the storage medium by interference between read pulses arising from adjacent transitions. This interference occurs because the read pulses overlap in time to some degree when the transitions are too closely spaced and it is aggravated by asymmetry and phase distortion of the read pulses resulting from differential phase shift of the constituent frequency components thereof which causes broadening of the individual pulses. It is well known in the magnetic data storage art, however, that the read pulses supplied from a magnetic read head typically contain such distortion and accordingly various tenchiques have been developed in the art to provide compensation therefor. Suitable phase compensation may be provided, for example, by the use of phase equalization means as disclosed in U.S. Pat. No. 3405403 issued Oct. 8, 1968 to G. V. Jacoby et al. In any event, even in the absence of such distortion and asymmetry or the provision of compensation therefor, if the read pulses overlap due to pulse crowding, interference will occur between adjacent pulses causing variable amplitude and shifting of the peaks of the read signal, so-called bit shift or peak shift, with resultant errors either as a consequence of failure to detect a transition indicative of a data bit or false interpretation of noise in the read signal as representative of a data bit.

The manner in which amplitude variation of the read pulses may affect signal detection capability will be discussed subsequently in greater detail with reference to the description of the peferred embodiments of the invention, but for the moment discussion will be confined to the matter of peak shift which is undesirable inasmuch as the peaks are representative of the data transitions recorded on the storage medium. For accurate signal detection the relative time occurrence of the peaks must be preserved in order to recover the data. It is therefore common practice in the magnetic data storage art to provide some sort of compensation or equalization which acts to narrow the width of the individual read pulses so that they do not appreciably overlap and thus do not cause intolerable peak shift or amplitude variation of the read signal. This equalization may be provided in the process of recording the data on the storage medium by acting on the recording signal, so-called write compensation, as exemplified by U.S. Pat. No. 3,503,059 issued Mar. 24, 1970 L. E. Ambrico. Alternatively, narrowing of the read pulses may be accomplished in the course of reading by acting directly on the read pulses, so-called read equalization, as disclosed in U.S. Pat. No. 3516066 issued June 2, 1970 to G. V. Jacoby. The present invention is concerned with read equalization. Hence, the remaining consideration of the prior art will be limited generally to that technique and discussed ultimately in relation to a particular state of the art signal detector circuit which is improved by means of the principles of the present invention.

As mentioned above, data recovery pursuant to reading from a magnetic storage medium is typically performed by sensing the occurrence of peaks of the read signal, and it is for that reason that provision is made for narrowing the read pulses so as to preclude interference therebetween which otherwise might intolerably shift the peaks. Additional factors attendant to pulse narrowing and which affect data recovery must also be considered, however, other than simply narrowing the pulses sufficiently to avoid interpulse interference. For instance, the more a pulse is narrowed, the greater its bandwidth becomes thus requiring a substantially commensurate increase of the read system bandwidth with an accompanying increase in noise. This is undesirable because noise which is at or near the peak of a read pulse can act to shift the peak of the pulse, so-called noise induced peak shift. It is therefore important to provide equalization which appropriately acts on the relatively broad read pulses so as to provide a degree of pulse narrowing sufficient to eliminate or at least substantially reduce interpulse interference, whereby peak amplitude variation and bit shift are satisfactorily avoided, but the pulse narrowing must not be so great as to substantially increase the required system bandwidth and thus unduly increase noise in the read system. To obtain this result, the individual read pulses should be narrowed so as to have a contained amplitude spectrum, that is, a spectrum of limited frequency range. The point is that since bit shift can be caused by both interpulse interference and noise, a tradeoff should be made with regard to pulse narrowing which has the affect of advantageously reducing interpulse interference but unfortunately concurrently enhancing noise. It should be noted though that noise enhancement due to pulse narrowing can be offset to some extent if the equalization is such that the narrowed pulses have an amplitude spectrum permitting reduced amplitude boost. This will be explained further hereinafter in connection with the detailed description of the invention. Increased noise can cause still other deleterious affects, however, which will be discussed in the following paragraph with specific reference to a dual channel detector circuit.

A dual channel signal detector circuit of the kind to which the invention relates is disclosed in U.S. Pat. No. 3631263 issued Dec. 28, 1971 I. H. Graham et al and comprises parallel connected peak detection and gate generation channels coupled to receive the read signal. The peak detection channel senses the peaks of the read signal in conventional manner to produce data pulses corresponding thereto, but as explained above, the occurrence of noise coincident with the read pulses can act to shift the pulses from their proper time positions thereby resulting in errors as a consequence of noise induced bit shift. The peak detection channel also responds to noise peaks in the baseline section of the read signal intermediate the individual read pulses and produces spurious non-data pulses representative of such noise along with the desired data pulses. These non-data pulses will not cause errors in a dual channel circuit where the gate generation channel responds to the read signal to produce successive gating pulses corresponding only to the individual read pulses. The pulses provided at the output of the peak detection and gate generation channels are then applied to an AND circuit for gating the data pulses to the exclusion of noise or non-data pulses. It will be appreciated, though, that noise present in the baseline regions of the read signal could generate erroneous gating signals which would act to gate non-data signals produced at the output of the peak detection channel and thus falsely result in interpretation of noise pulses as representative of data. For these reasons it is important to restrict the read system bandwidth in order to preclude or at least reduce both noise induced peak shift and the production of spurious non-data pulses in the peak detection channel and to avoid generation of erroneous gating signals in the gate generation channel.

From the foregoing comments it will be appreciated that the signal applied to the peak detection and gate generation channels should have certain characteristics regarding the amplitude, time duration, amplitude spectrum and phase spectrum of its individual pulses and further regarding the flatness of the baseline sections of the signal intermediate the pulses so that both channels and particularly the gate generation channel can respond to the signal in a manner to assure accurate and reliable detection. Presently available signal detector circuits, including the dual channel type circuit to which the invention relates, provide various ones or combinations of these characteristics but nevertheless are lacking in one respect or another and especially in their ability to provide reduced noise enhancement and protect against generation erroneous gating pulses.

SUMMARY OF THE INVENTION

The above mentioned limitations of presently available signal detector circuits are overcome by the provision of a new and improved dual channel signal detector circuit which includes an equalizer coupled to receive a phase compensated read signal having data representative peaks, referred to hereinafter as a variable peak amplitude input signal, and transform it to a constant peak amplitude output signal having data representative pulses each corresponding to a respective peak of the input signal, where each pulse is appropriately limited in time and substantially flat at the zero level on each side thereof with an amplitude spectrum and associated linear phase spectrum contained within a prescribed limited frequency band. The output of the equalizer is coupled in one embodiment of the invention to the inputs of both the peak detection and gate generation channels of the detector circuit. In other embodiments the equalizer may be coupled in only one or the other of the two channels but in any case is preferred at least for incorporation in the gate generation channel. Obviously, if the equalizer is used, for example, only in the gate generation channel, a different equalization function may be implemented in the peak detection channel. In any event, irrespective of whether the equalizer provided in accordance with the invention is used in one or both channels of the detector, the preferred form thereof provides even-function and preferably substantially cosine-fourth-power amplitude spectrum shaping, that is, the equalizer responds to an isolated time domain pulse input so as to provide an isolated time domain output having a substantially cosine-fourth-power amplitude spectrum in the frequency domain. This shaping is particularly well suited for use with the 3PM code described in United States patent application Ser. No. 705199 filed July 14, 1976 in the name of G. V. Jacoby as sole inventor and assigned to the assignee of the instant invention. It is to be understood, however, that the invention is not limited to use with such code but indeed is also useful with NRZ (non return to zero) type codes and run length limited codes in general, and may very well have utility with still other type codes as will be apparent to those skilled in the art from a reading of the subsequent detailed description.

Even-function amplitude spectrum shaping in general and the preferred cosine-fourth-power amplitude spectrum shaping, in particular, advantageously compensates the variable peak amplitude input signal applied to the equalizer so as to transform it into a constant peak amplitude output signal having narrowed pulses with a prescribed amplitude spectrum of limited frequency range. These characteristics substantially eliminate both interpulse interference type bit shift and the so-called noise induced bit shift whereby accurate timing of the data pulses derived from the peak detection channel is obtained. The preferred amplitude spectrum shaping also functions to transform the variable peak amplitude input signal such that the pulses of the equalizer output signal are substantially flat at the zero level on each side of the pulses. This characteristic of flatness intermediate the pulses reduces production of non-data pulses and erroneous gating pulses in the peak detection and gate generation channels respectively, and functions in combination with the other aforementioned characteristics to assure more accurate and reliable signal detection. Further, the provision of a constant peak amplitude signal at the output of the equalizer enables the gate generation channel (referred to hereinafter, in the case of the present invention, as an amplitude detection channel) to operate on a simple amplitude threshold detection technique toggling back and forth between positive and negative amplitude threshold reference levels for detection of the alternate positive and negative data respresentative pulses of the equalizer output signal.

From the foregoing comments it will be appreciated that it is a principal object of the invention to provide an improved signal detector circuit including equalizer means for acting on a variable peak amplitude input data signal in a manner to provide a substantially constant peak amplitude output signal having prescribed characteristics, independent of the input data pattern, for application to separate peak detection and amplitude detection channels whereby the relative time occurrence of data representative peaks of the input signal may be more accurately determined in the peak detection channel and the amplitude channel may operate on a simple amplitude threshold detection basis to exclude noise present in the baseline of the input signal from being transferred to the circuit output.

The above and other objects of the invention will be more fully understood from a reading of the ensuing detailed description of the preferred embodiments given with reference to the appended drawings.

DESCRIPTION OF PREFERRED EMBODIMENTS

Since the invention is an improvement of the signal detector circuit disclosed in the aforementioned Graham et al patent it is worthwhile to consider briefly the circuits described therein. This will facilitate the explanation and should aid in the appreciation and understanding of the distinguishing features of the invention. The circuit illustrated in FIG. 1 corresponds to that shown in FIG. 8 of the Graham et al patent. Read head 12 provides an input read signal by responding to data recorded on a storage medium such as a magnetic disc or tape not shown in the drawing. The signal supplied by the read head is applied through a linear amplifier and filter 14 and a differentiator 16 to peak detection channel 18 and to gate generation channel 20. Detector 22 of the peak detection channel functions to form a sequence of data pulses each and corresponding in time coincidence to a data representative peak of the read signal. Delay element 24 then delays the data pulses in time to coincide with pulses provided at the output of the gate generation channel which simultaneously responds to the differentiated input signal to produce a gating pulse corresponding to each data respresentative peak of the input signal. The gate generation channel is also intended to function so as not to produce gating pulses corresponding to non-data peaks caused by noise or distortion appearing in the circuit. the data pulses of peak detection channel 18 and the gating pulses of gate generation channel 20 are thus applied in time coincidence to AND gate 26 whereby there is provided at the output thereof gated data pulses representative of the data transitions recorded on the storage medium associated with read head 12.

Figure 1:
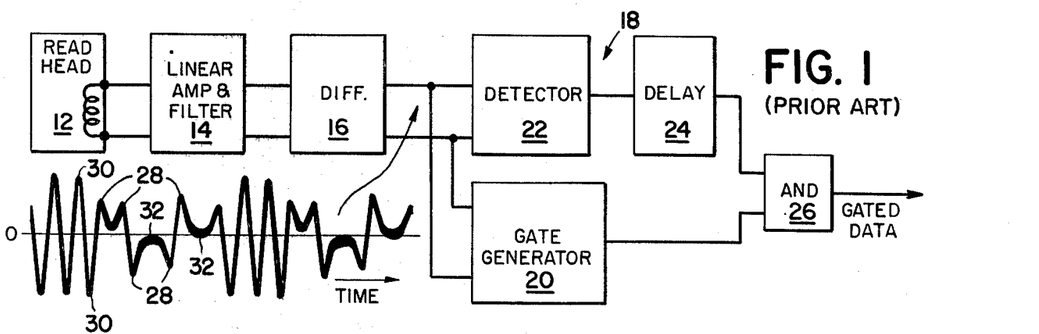
FIG. 1 is a block diagram of a prior art signal detector circuit of the type relating to and over which improvement is made by the present invention.

The circuit shown in FIG. 1 may be modified by disconnecting the gate generation channel 20 from the output of differentiator 16 and connecting it to the output of linear amplifier and filter 14 so that an amplified and filtered form of the read signal is applied directly to the gate generation channel. This configuration of the prior art signal detection circuit corresponds to that shown in FIG. 3 of the Graham et al patent. The comments made in the next few paragraphs concerning the operational features of these prior circuits are made specifically with reference to the illustrated prior art circuit of FIG. 1 but will be appreciated as being applicable as well to the above described modification thereof although not necessarily in exactly the same manner on a quantitative basis.

The voltage waveform appearing at the output of differentiator 16 indicates the occurrence of low amplitude peaks 28 relative to high amplitude peaks 30 and comparatively lengthy baseline sections 32 separating some of the low amplitude peaks. These characteristics of the differentiator output waveform will be understood from a momentary consideration of the nature of the signal supplied by read head 12. First, it will be appreciated that comparatively long baseline secions may also be present in the read signal supplied from the magnetic read head as indicated by their presence in the differentiated read signal. Further, the input signal is amplitude attentuated in regions of high packing or transition density on the storage medium as a result of interpulse interference, that is, interference between adjacent read pulses relating to respective transitions. Now, although the read signal is amplitude attentuated in regions of high transition density, it will be recognized that the slope of the read signal from peak to peak is also greater in these regions because of the close spacing of the transitions, and therefore high amplitude peaks appear in the differentiator output waveform in regions of high transition density while low amplitude peaks occur in regions of low transition density. Thus, in the differentiated waveform relating to the circuit of FIG. 1, low amplitude peaks 28 and high amplitude peaks 30 correspond to read pulses of comparatively low and high transition density regions respectively. Such amplitude variations and the presence of long baseline sections, whether occurring in the read head signal or the derivative thereof can impair accurate and reliable detection of the recorded data, particularly where the gate generation channel operates on an amplitude threshold detection basis. More specifically, errors can occur as a result of amplitude attentuation whereby pulses representative of actual data may fail to be detected. Errors can also occur, particularly in the long baseline sections, as a result of noise distortion appearing therein whereby spurious non-data pulses may erroneously be interpreted as representative of data. This will be comprehended more fully from a reading of the following paragraph.

Referring to the differentiated waveform associated with FIG. 1, it is seen that the low amplitude peaks 28 are typically about fifty percent of the high amplitude peaks 30 and that the amplitude of the baseline section may be as much as twenty percent of the low amplitude peaks although it is usually substantially lower. It would appear therefore that a gate generator using a simple amplitude threshold detection technique with a threshold level set at about 35 percent of the high amplitude peak would be satisfactory for detecting data pulses and suppressing spurious non-data pulses. As a practical matter, however, it has been found that both the high and low amplitude peaks may intermittently be reduced by as much as 50 percent from the indicated levels as a result of noise arising from defects in the storage media combining with other noise normally present in the circuit. This can cause the low amplitude peaks to be reduced in amplitude to only about 25 percent of the normal high amplitude peak value and thus not be detected by a threshold set at 35 percent thereof. This failure to detect a data representative peak is referred to as drop-out error. On the other hand, if the threshold level is reduced to 25 percent of the normal high peak amplitude or slightly lower to avoid drop-out error, a storage media defect may spuriously increase the baseline noise level to the extent that it exceeds the reduced threshold causing error as a result of falsely interpreting noise as representative of data. This is referred to as drop-in error. As is known in the art, an automatic gain control circuit can be used in either the circuit of FIG. 1 or the above described modification thereof and connected therein prior to the input of the peak detection and gate generation channels either at the output of the differentiator or the output of the linear amplifier and filter to alleviate somewhat the problem of drop-in and drop-out errors. An automatic gain control circuit serves, however, to maintain the read signal at constant peak amplitude only with respect to slow rate variations thereof such as result from changes in the speed if the storage medium relative to the read head. Hence, changes in signal amplitude occurring at the instantaneous frequency of the read signal are not compensated by automatic gain control.

Noise produced by media defects or otherwise present in the read system can cause errors in the manner explained above with any of the run length limited data encoding techniques well known to those skilled in the art, but on a statistical basis media produced noise is more likely to introduce errors in the case of codes such as the 3PM code disclosed in the above mentioned Jacoby applicaion where the maximum interval between transitions is relatively long although still sufficiently short to maintain self-clocking. As a consequence of these effects it would appear that a gate generation channel operating on an amplitude threshold detection basis could not provide reliable detection. It has been found, however, that amplitude threshold detection for generating the data gating pulses is indeed satisfactory if the read signal is appropriately transformed so that media produced noise and other noise and distortion present in the circuit cannot adversely affect the transformed signal. Such transformation of the read signal is achieved by suitably narrowing the read pulses so as to reduce interpulse interference and is provided as one feature of the present invention as will now be descried with reference to FIGS. 2 and 3.

Figure 2:
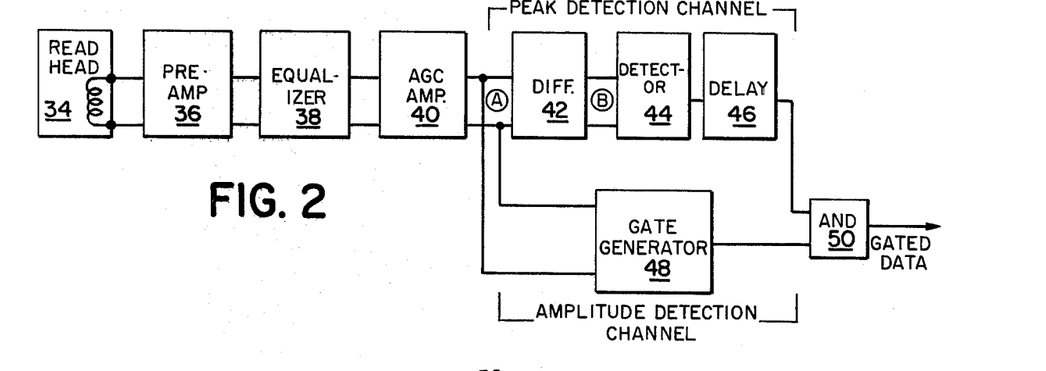
FIG. 2 is a block diagram of a preferred embodiment of the present invention.

The embodiment of the invention shown in FIG. 2 comprises a read head 34 which provides a read signal that is applied through preamplifier 36, equalizer 38 and automatic gain control circuit 40 to peak detection and amplitude detection channels. The peak detection channel comprises differentiator 42, detector 44 and delay element 46 which function essentially the same as the corresponding elements in the prior art circuit to provide data pulses coincident in time with the data representative peaks of the read signal supplied from read head 34. Likewise, the gate generator 48 of the amplitude detection channel serves, as in the case of the prior art circuit, to provide gating pulses for precluding errors which otherwise may occur due to the presence of noise in the baseline sections of the read signal. The gating pulses provided by the amplitude detection channel are then applied, along with the data pulses provided at the output of the peak detection channel, to AND gate 50 which responds to the applied pulses to produce gated data pulses representative of the transitions recorded on a storage medium associated with read head 34.

Figure 3:
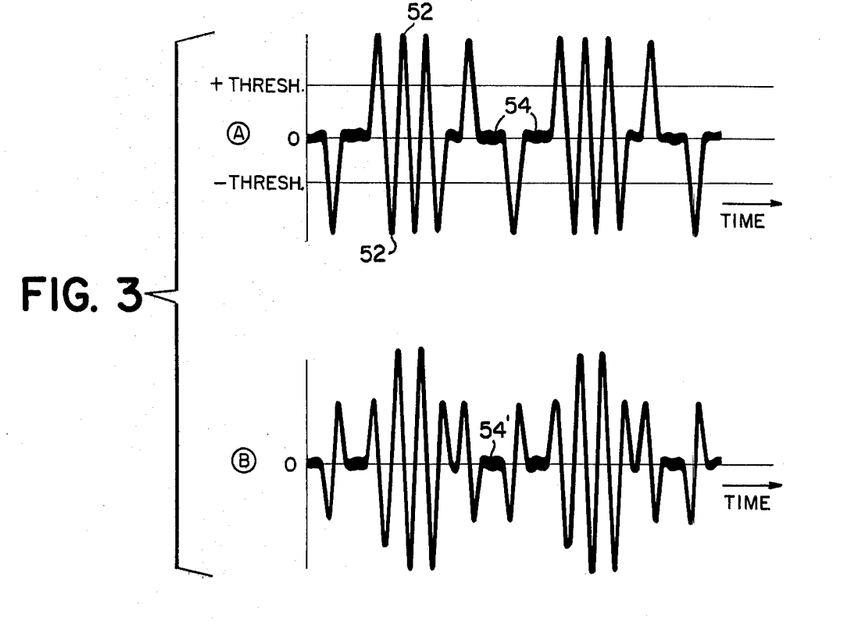
FIG. 3 is an illustration of voltage waveshapes produced at the input and output of the differentiator in the circuit of FIG. 2 in response to an input signal provided by the read head.

Operation of the gate generator as an amplitude threshold detecton device is made possible because the equalizer 38 acts on the signal applied to its input so as to produce at its output and at the output of automatic gain control amplifier 40 a substantially constant peak amplitude signal having equal positive and negative peaks 52, independent of the pulse spacing provided by the data pattern, as indicated by waveform A of FIG. 3. Since all the peaks of the equalizer output signal are of constant amplitude, the amplitude detection threshold may be set at say 45 percent of the peak amplitude and still assure triggering of the gate generator so as to avoid drop-out error even at the occurrence of media defect produced noise or other noise which might reduce the peak amplitude by as much as 50 percent. Moreover, a gate generator triggering threshold of 45 percent of normal peak amplitude will adequately protect against drop-in error caused by noise or distortion present in the baseline sections 54 of the equalizer output signal.

Waveform B of FIG. 3 depicts the equalized signal after differentiation in the peak detection channel. The baseline sections 54' are essentially flat and the variable amplitude peaks existing in this signal are of no consequence insofar as peak detection is concerned. The significant characteristics of the equalizer for the purpose of peak detection relate to the width and the amplitude and phase spectra of the equalized pulses. These characteristics and the additional characteristics of constant peak amplitude and baseline flatness are significant also for proper gate generation and will now be discussed in greater detail with reference to FIGS. 4 to 7, after which means for implementing the equalizer will be described.

Figure 4:
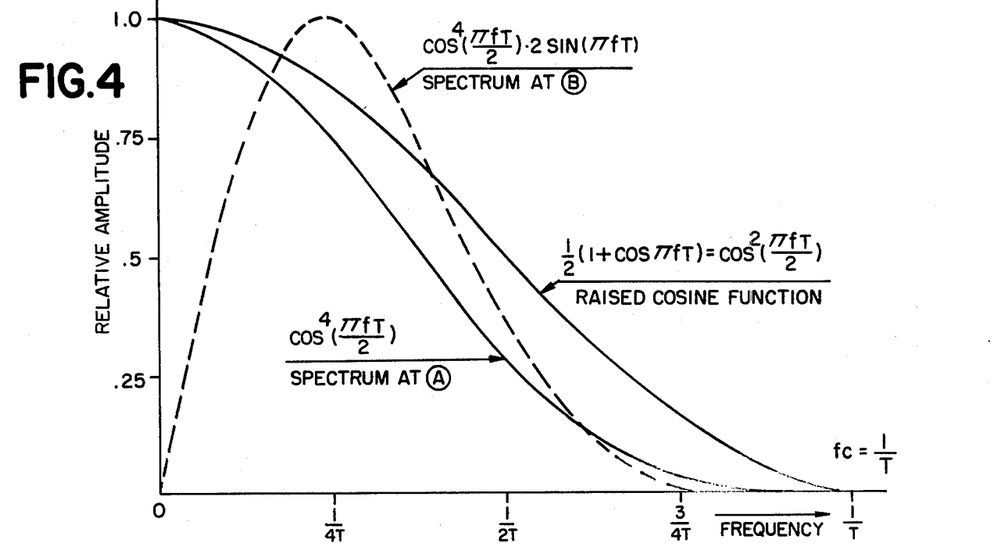
FIG. 4 depicts amplitude spectra having cosine-squared and cosine-fourth-power functional characteristics and further depicts the amplitude spectrum obtained by time domain differentiation of a pulse having a cosine-fourth-power amplitude spectrum.
Figure 5:
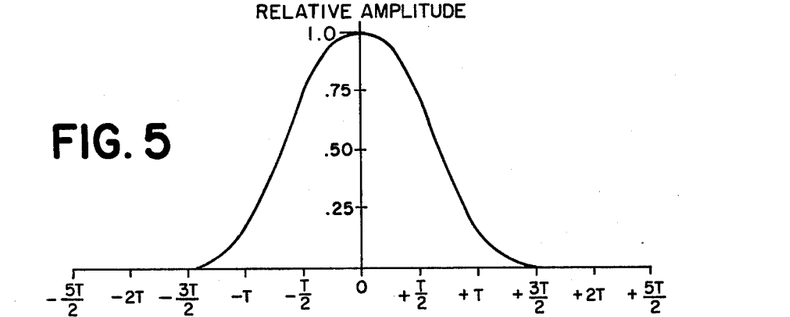
FIG. 5 depicts a time domain amplitude waveform having a cosine-fourth-power amplitude spectrum.
Figure 6:
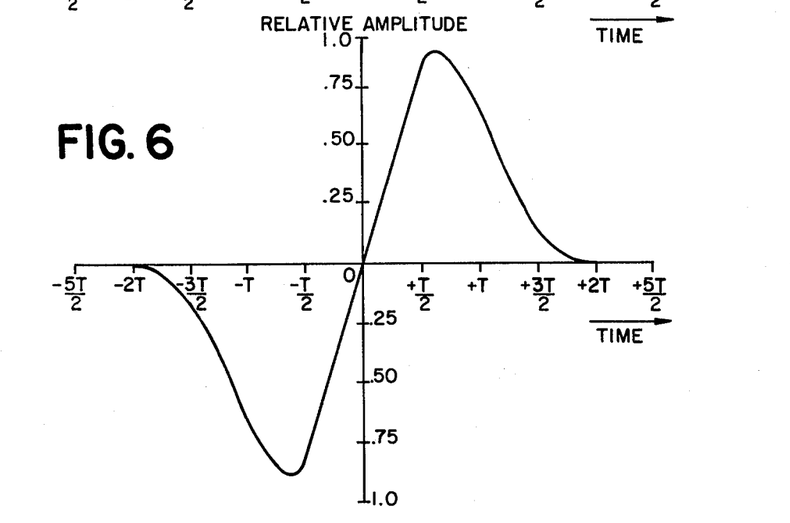
FIG. 6 shows the time domain derivative corresponding to the pulse illustrated in FIG. 5.
Figure 7:
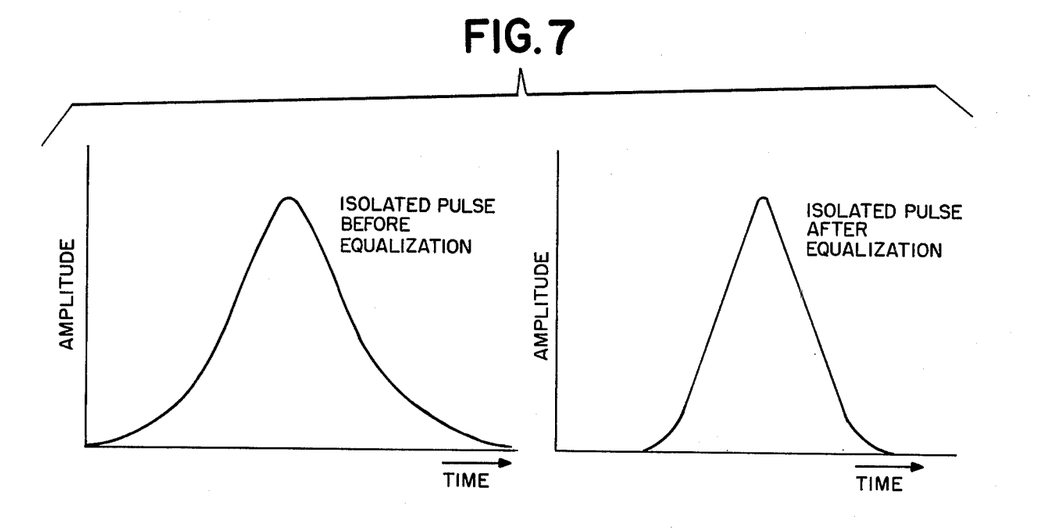
FIG. 7 depicts amplitude waveforms on a common time scale of an isolated pulse before and after equalization where the latter corresponds to the waveform of FIG. 5.

The narrowed pulses provided at the output of the equalizer preferably have a substantially cosine-fourth-power amplitude spectrum contained in a limited low pass frequency band having a cutouff frequency $fc = 1/T$, as indicated by the curved designated $\cos^4(\pi ft/2)$ in FIG. 4. A narrowed isolated time domain pulse relating to this amplitude spectrum is shown in FIG. 5 and is seen to touch the zero baseline at the ±3T/2 points and remain essentially flat at zero beyond those points. The derivative of the pulse of FIG. 5 is shown in FIG. 6 and the amplitude spectrum of the differentiated wave is indicated in FIG. 4 by the curve designated $\cos^4(\pi fT/2) \cdot 2 \sin(\pi fT)$. This function is obtained by use of the delay line type differentiation disclosed in the above mentioned Jacoby U.S. Pat. No. 3516066. FIG. 7 shows isolated time domain pulses before and after equalization on a common time scale where the before equalization pulse represents an input signal applied to the equalizer. The after equalization pulse represents the output signal of the equalizer in response to the input pulse signal and corresponds to the pulse depicted in FIG. 5. It is seen that the after equalization pulse in this instance has a width at the half amplitude point equal to about two-thirds the width at the corresponding point of the before equalization pulse thereby avoiding undue increase of the bandwidth as occurs where the degree of pulse narrowing is made substantially greater. In any event though, the degree of pulse narrowing provided by the equalizer is sufficient to make the individual pulses essentially completely resolvable from one another. It will also be noted that both the before and after equalization pulses are symmetrical about their peaks thus indicating an absence of phase distortion in both pulses, and further indicating that the equalizer functions to achieve the desired pulse narrowing without disturbing the linear phase spectrum of the pulse. It should also be noted that a read signal provided by a magnetic read head is typically phase distorted as evidenced by asymmetry of the read pulses. The before equalization pulse of FIG. 7 therefore represents a read pulse which has been phase compensated to provide the illustrated symmetrical pulse having a linear phase spectrum. Such compensation may be provided by phase equalizer means as disclosed in the aforementioned Jacoby et al U.S. Pat. No. 3405403. The phase equalizer may be incorporated in the circuit of FIG. 2 intermediate the preamplifier 36 and equalizer 38 of alternatively, for example, may be constructed as part of the equalizer 38.

Referring again to FIG. 4, the amplitude spectrum of a raised cosine or cosine-squared function is also illustrated therein for purpose of comparison with the preferred cosine-fourth-power function. It will be noted that both functions have the same cutoff frequency $fc = 1/T$ but the cosine-fourth-power function requires less amplitude boost over the passband and thus provides less noise enhancement, that is, less amplification of noise that may be present in the passband when narrowing the input pulses to avoid interference therebetween. The amplitude spectrum of the differentiated pulse in the peak detection channel has greater amplitude boost and thus is somewhat more susceptible to noise, but this is blocked from appearing at the output of the signal detector circuit by the action of the gate generator as has been previously explained.

The use of cosine-squared shaping in the receiver of a communications channel is known in the art as exemplified by U.S. Pat. No. 3647964, issued Mar. 7, 1972 to D. T. Tang, wherein it is shown that the related time domain pulse has a first zero crossover at ±T and additional crossovers at 0.5T spacings beyond the first crossover, where I is the reciprocal of the cutoff frequency. As shown in FIG. 3 of the Tang patent, these additional zero crossovers produce an oscillatory tail on the time domain pulse. Tang teaches that these additional crossovers can be advantageously used by transmitting successive data pulses at intervals equal to $nT/2$ where $n$ is any integer equal to or greater than two. In this way, the data pulses can be sampled at integer multiples of 0.5T without interpulse interference provided no two pulses are spaced less than T. In other words, if a second pulse occurs only at intervals of T, 1.5T, 2T etc. following a first pulse, no interference will occur between pulses because the first pulse will be at a zero crossover point when the second pulse is sampled. In the case of a magnetic data storage system, interpulse interference would appear to be similarly avoided by recording the data transitions on the storage medium so as to cause read pulses at the specified intervals. However, presence of bit shift to one degree or another in a magnetic data storage system makes the situation considerably more complex for the simple reason that it cannot be assure that one read pulse will indeed occur at a zero crossover point of another read pulse. The preferred cosine-fourth-power spectral shaping substantially obviates this problem because it corresponds to a pulse which may be regarded as devoid of any oscillatory tail at least to the extent required for providing the required flatness at the zero level in the region intermediate pulses, that is, in the regions beyond the zero baseline touching points of ±3T/2, so as to assure reliable operation of the amplitude detection channel. In reality the pulse of FIG. 5 has an oscillatory tail, but its peaks are only about one-sixth the magnitude of the peaks of the tail produced with a pulse having a cosine-squared amplitude spectrum. for an identical low band pass with cutouff frequency $fc = 1/T$, cosine-cubed spectral shaping provides somewhat higher amplitude boost than a cosine-fourth-power functions and a pulse having an undesirably high amplitude oscillatory tail in the manner of a cosine-squared function whereas cosine-fifth-power spectral shaping provides somewhat less amplitude boost and a pulse having an oscillatory tail of even smaller magnitude than a cosine-fourth-power function. Cosine-fifth-power spectral shaping therefore also provides generally satisfactory equalization but is not considered quite as suitable as the cosine-fourth-power function because the corresponding time domain pulse is not narrowed quite as much and thus slightly degrades the operation of both the peak detection channel and the amplitude detection channel. In addition to its other attributes, an equalizer providing cosine-fourth-power spectral shaping, corresponding to a pulse which touches the zero baseline at the ±3T/2 points, is uniquely suited for detection of 3PM code having a minimum transition interval of 3T/2.

It was mentioned hereinbefore that for desired operation of the peak detection channel, the equalizer must transform the pulses at its input to appropriately narrowed output pulses having a contained amplitude and linear phase spectrum. The provision of these characteristics by the equalizer has been explained in the preceding paragraphs. It is of further interest to note, however, referring to FIG. 6, that the differentiated pulse after equalization does not touch the zero baseline until the ±2T points and is actually at a finite signal level at the ±3T/2 points notwithstanding the provision of the equalization. As a result, interpulse interference can occur in the peak detection channel in the case of 3PM code for which the minimum transition spacing is $1.5T_B$, where $T_B$ is the data bit period, in the particular case where T is set equal to $T_B$. This interference can be avoided by increasing the bandwidth. More specifically, it is seen in FIG. 6 that the differentiated pulse is approximately at the zero level at ±1.88T. Thus, the minimum interval required between transitions or read pulses, to substantially avoid interpulse interference in the peak detection channel, need not be 2I but in fact could be reduced to 1.88T. Proceeding on this basis, then the minimum spacing ($T_{MIN}$) between pulses should be in the range of 1.88T to 2T where, as previously indicated, I is the reciprocal of the cutoff frequency $fc$. To satisfy this requirement for 3PM code for which $T_{MIN} = 1.5T_B$, the cutoff frequency $fc = 1/T$ should be in the range of $1.25/T_B$ to $1.33/T_B$. In other word, for 3PM code the cutoff frequency should be made 25 percent to 33 percent higher than the data bit rate to avoid interpulse interference in the peak detection channel. This interference can be easily compensated and avoided without need for increasing the bandwidth by the provision of so-called prewrite compensation, a technique well known in the art for compensating for bit shift by shifting the transitions a small amount during the course of recording in the direction opposite to the shift that results from interpulse interference. Referring to FIG. 5, it is seen that the pulses provided at the equalizer output are relatively flat in the vicinity of the ±3I/2 zero touching points. Therefore, asmall shift of the peak of an adjacent pulse located at either of these points will result in negligible interpulse interference. Hence, where equalization providing a cosine-fourth-power spectrum is combined with prewrite conpensation, the minimum interval between pulses can be made equal to 1.5T; and since for 3PM code $T_{MIN}$ = $1.5T_B$, the required cutoff frequency can be made equal to the reciprocal of the data bit rate for 3PM code, resulting in considerable bandwidth reduction without undue interpulse interference occurring in either channel of the circuit.

It should be understood and will in fact be appreciated by those skilled in the art that the invention is useful not only with 3PM code for which the minimum pulse or transition spacing is ±$3T_B/2$ corresponding to the time domain zero touching points of the equalizer output signal when $fc = 1/T_B$ but also with MFM and M²FM codes and in fact is useful with NRZ type code or any run length limited code. This is so because the time domain response is substantially flat beyond the zero touching points and these points (±3T/2) can be made to correspond to the minimum pulse or transition interval of NRZ or any run length limited code. The positions at which other pulses or transitions occur at intervals greater than the minimum interval for any code is of no significance because the equalizer output pulses are substantially flat at the zero level at positions beyond the minimum pulse interval.

Figure 8:
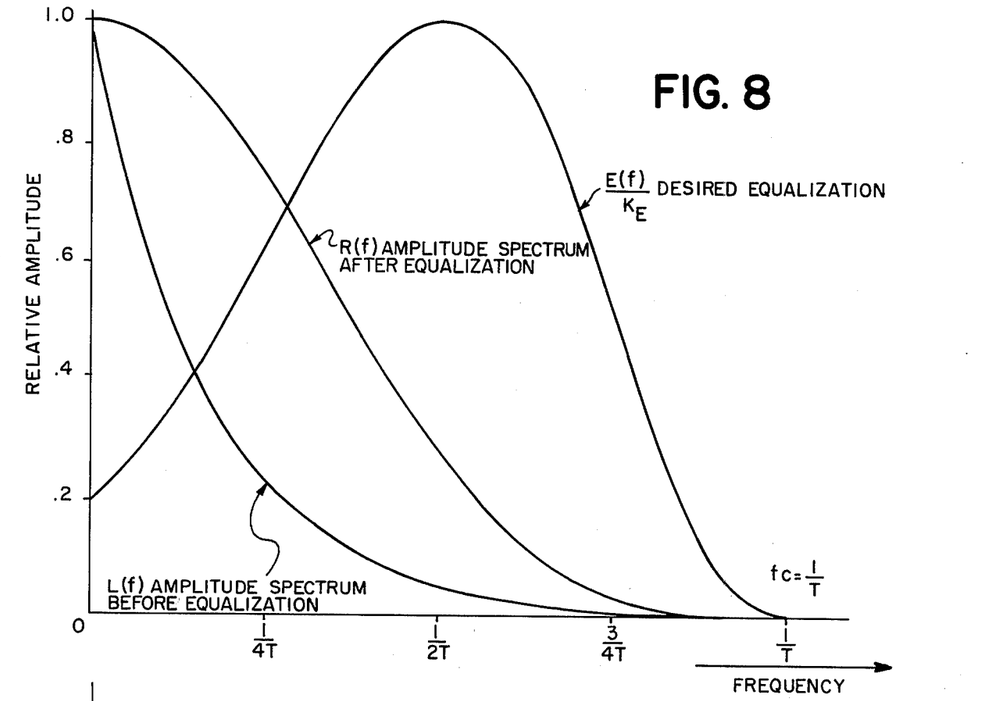
FIG. 8 is a graph of the amplitude spectra of the waveforms of FIG. 7 and of a related desired equalization function.

The implementation of an equalizer which provides cosine-fourth-power amplitude spectrum shaping will now be described with reference to FIGS. 8 through 12. An isolated before equalization pulse (FIG. 7) of a magnetic read system typically has a Lorentzian characteristic, which may be represented mathematically as $1/[1+(2T/T_{50})^2]$ where T denotes time and $T_{50}$ is the time width between half amplitude points of the pulse before equalization, and a frequency-normalized amplitude spectrum represented by the curve designated $L(f)$ in FIG. 8. The curve designated $R(f)$ depicts the amplitude spectrum of the isolated pulse desired after equalization. The curves $L(f)$ and $R(f)$ may be represented mathematically as follows:

$$L(f) = e^{-\pi T_{50} f}$$
$$R(f) = \cos^4 \frac{\pi f}{2fc}$$

where $f$ represents frequency, $fc$ is the system bandwidth or cutoff frequency, T is the reciprocal of the cutoff frequency and $T_{50}$ is the time duration at the half amplitude points of the pulse before equalization.

In order to transform the amplitude spectrum $L(f)$ to an amplitude spectrum $R(f)$ an equalizer function $E_D(f)$ is desired such that $$L(f) \cdot E_D(f) = R(f)$$

This desired equalizer function is represented by the curve designated $E(f)/K_E$ in FIG. 8, that is, the equalizer function normalized to a value of $K_E$. By means of numerical analysis it can be determined that the desired equalizer function $E_D(f)$ can be represented mathematically to a close approximation as $$E_D(f) = K_1(1 - K_2 \cos \frac{2\pi f}{fn}) \cdot B(f)$$
$$= V_c \cdot B(f)$$
$$= V_E$$

where again $f$ represents frequency, $K_1$ and $K_2$ are constants, $fn$ is a frequency scaling parameter, and $B(f)$ is a fourth order Bessel filter, preferably a Bessel-Unbehauen filter.

Figure 9:
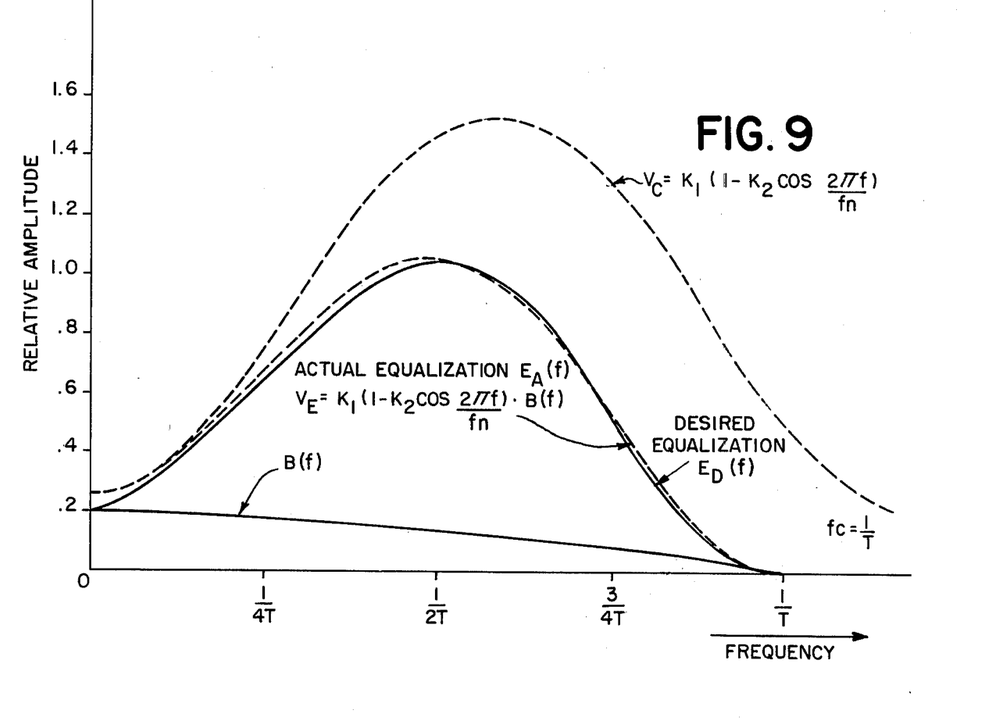
FIG. 9 is a graph of amplitude transfer functions obtained with filters used in the preferred embodiments of the invention, and also indicates the actual equalization function produced by the combination of such filters relative to the theoretically desired equalization function shown in FIG. 8.

FIG. 9 indicates that the product of the $V_c$ and $B(f)$ spectral density functions provides an actual equalization spectral density function $E_A(f)$ which closely approximates the desired equalization function $E_D(f)$ over the system bandpass. If an ordinary Bessel filter is used in place of the preferred Bessel-Unbehauen filter, the $B(f)$ curve will not reduce to zero at $1/T$ and the actual equalization $E_A(f)$ likewise will not reduce to zero but instead will deviate from the indicated curve in a small frequency range immediately below the cutoff frequency.

It will be appreciated by those skilled in the art that the balanced ended equalizer 38 used in the present invention is preferred because it provides substantially greater noise rejection than can be obtained with a single ended input and output (unbalanced) equalizer. However, before proceeding to a description of the balanced circuit implementation of the actual equalizer function used in the present invention, it will be helpful in obtaining an understanding thereof to first consider momentarily the operation of a known unbalanced cosine equalizer shown in FIG. 10.

Figure 10:
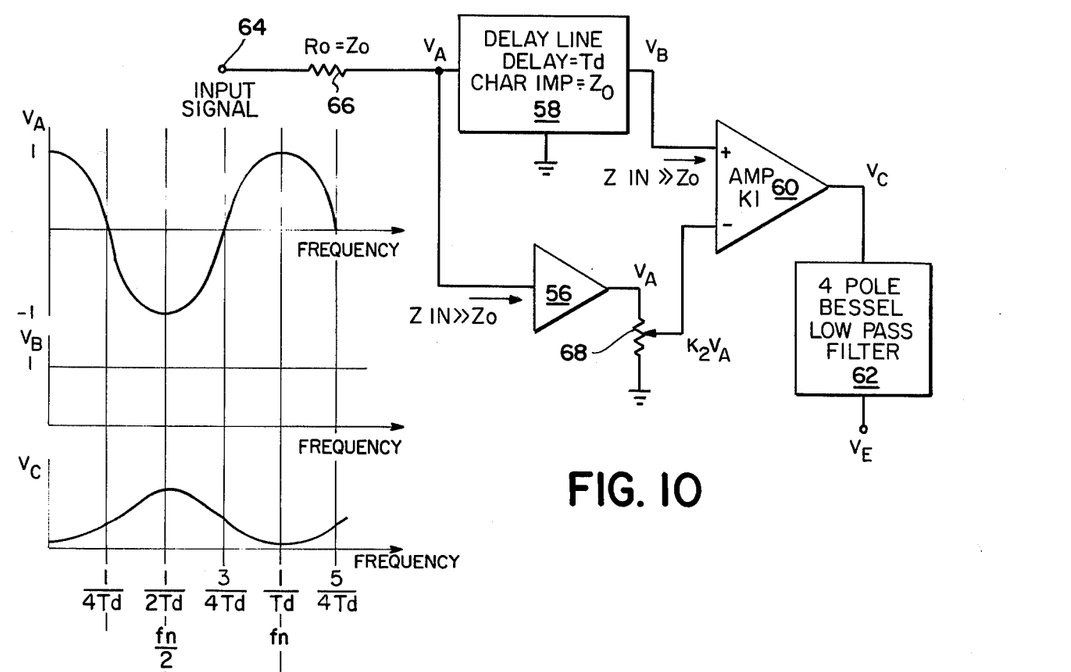
FIG. 10 illustrates a known equalizer circuit and its associated voltage transfer functions which are useful for obtaining an understanding of the operation by which the actual equalization function of FIG. 9 is obtained.

The cosine equalizer circuit of FIG. 10 comprises a parallel connected emitter follower 56 and delay line 58 coupled through a differential amplifier 60 to a four pole Bessel low pass filter. The delay line gas a characteristic impedance $Z_o$ and a delay $T_d = 1/fn$. An input signal supplied from a substantially zero impedance source, such as the output of a single ended preamplifier, is applied to input terminal 64 which is coupled by resistor 66 to the input of the emitter follower and delay line. The input impedance at the positive input terminal of differential amplifier 60 is a couple of orders of magnitude greater than the characteristic impedance of delay line 58 so that the output end of the delay line is effectively an open circuit. As a consequence, for a unit amplitude sine wave input signal 64, the voltage $V_B$ at the delay line output is a constant as a function of frequency while the voltage $V_A$ at the input to the delay line varies as a function of frequency because of the wave reflections produced by the open circuit at the output end of the delay line. Since only a portion $K_2V_A$ of the sinusoidal voltage $V_A$ provided at the output of emitter follower 56 is picked off resistor 68 for application to the negative input terminal of differential amplifier 60, the sinusoidal voltage $V_C$ produced at the output thereof varies as indicated by the $V_C$ waveform. The voltage $V_C$ then acts through the Bessel filter 62 to produce a sinusoidal voltage $V_E$ which has a characteristic as a function of frequency corresponding to the actual equalizer function $E_A(f)$ of FIG. 9.

Figure 11:
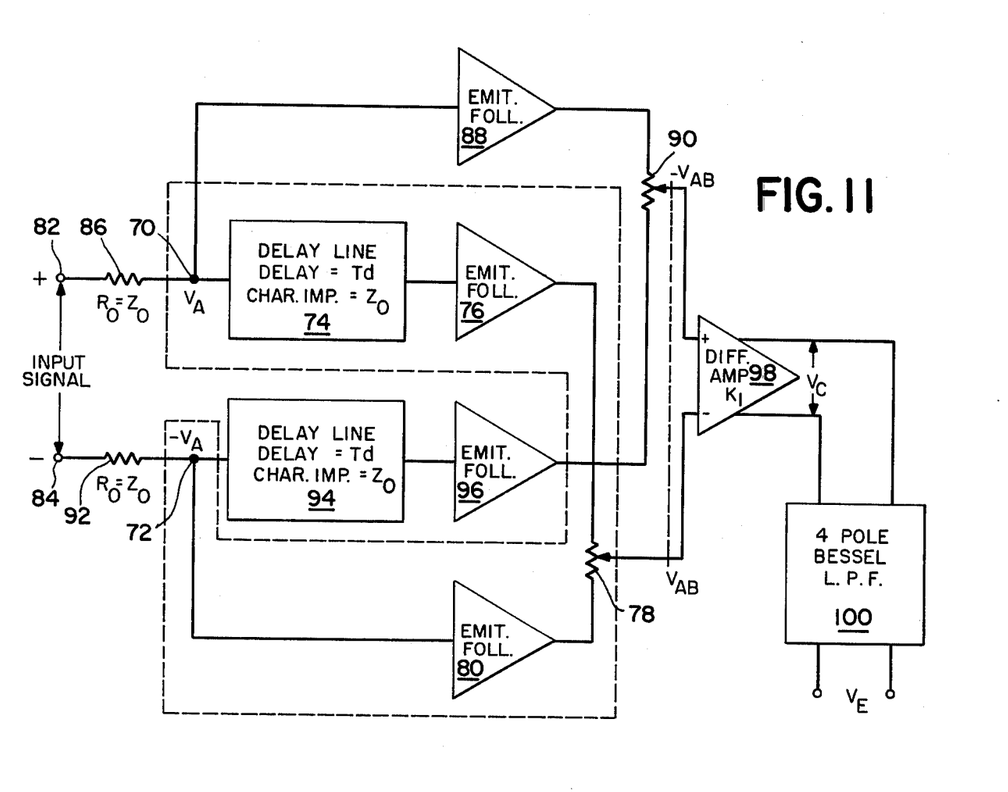
FIG. 11 is a schematic block diagram of a balanced equalizer circuit used in the preferred embodiments of the invention for achieving the actual equalization function illustrated in FIG. 9.
Figure 12:
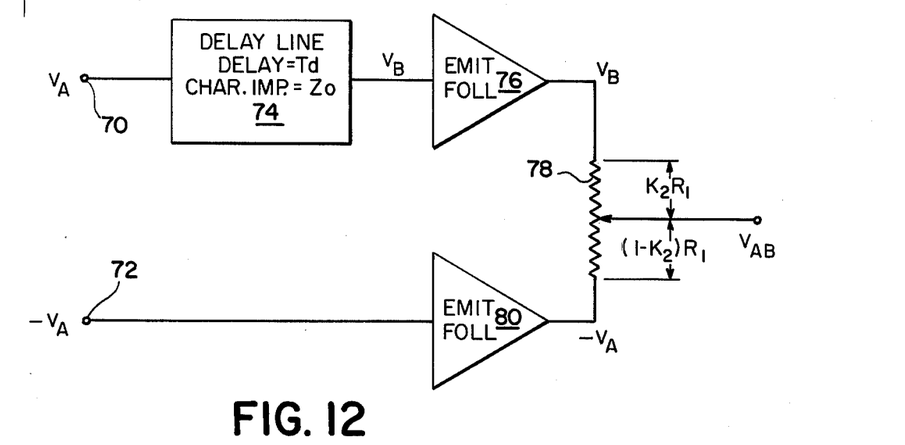
FIG. 12 is a schematic block diagram of a part of the balanced equalizer circuit shown in FIG. 11.

Now consider the operation of the balanced cosine equalizer circuit shown in FIG. 11. In this case a voltage $+V_A$ is applied to terminal 70 while a voltage $-V_A$ is applied to terminal 72. These voltages are derived from the output of preamplifier 36 of FIG. 2, which furnishes the signal at the input terminals 82 and 84. FIG. 12 depicts the part of the cosine equalizer enclosed by the dashed line in FIG. 11 and will now be described for the purpose of facilitating an explanation and understanding of the preferred balanced cosine equalizer. The signal $+V_A$ applied to terminal 70 feeds through delay line 74 producing a constant signal $V_B$ at the output thereof which in turn is coupled through emitter follower 76 to one end of potentiometer 78 having a resistance value $R_1$. The signal $-V_A$ applied to terminal 72 feeds through emitter follower 80 which has its output coupled to the other end of potentiometer 78. Thus, with the potentiometer wiper arm set to pick off a portion $(1-K_2)$ of signal $V_B$ and a portion $K_2$ of signal $-V_A$, the signal $V_{AB}$ produced on the wiper arm is $$V_{AB} = (1 - K_2)V_B - K_2V_A$$
$$= (1 - K_2) \cdot (V_B - \frac{K_2V_A}{1 - K_2})$$
$$= k(V_B - K'_2V_A)$$

where $k = (1 - K_2)$ and $$K'_2 = \frac{K_2}{1 - K_2}$$

In the case of the balanced cosine equalizer circuit of FIG. 11, the double ended signal supplied from preamplifier 36 is applied to equalizer 38 input terminals 82 and 84. Input terminal 82 couples through resistor 86 to the input of delay line 74 and the input of emitter follower 88 which has its output connected to one end of potentiometer 90. Input terminal 84 couples through resister 92 to the input of emitter follower 80 and the input of delay line 94 which is coupled through emitter follower 96 to the other end of potentiometer 90. Thus, with the wiper arms of potentiometers 78 and 90 set to matching positions, a signal $$2V_{AB} = 2k(V_B - K'_2V_A)$$

is applied to the input terminals of differential amplifier 98 which is responsive thereto to procude at its output a signal $$V_C = K_1 \cdot 2V_{AB}.$$

This equation for $V_C$ is seen to have the same functional relationship with respect to a balanced input circuit as is obtained with the unbalanced input circuit of FIG. 12 and its similarity to the previously stated equation for $V_C$ is immediately apparent, namely $$V_c = K_1(1 - K_2 \cos \frac{2\pi f}{fn})$$

The signal $V_C$ is then applied to the balanced Bessel low pass filter 100 to provide the balanced equalizer output $V_E$.

The delay lines in the circuits of FIGS. 10, 11 and 12 all have a delay $T_D = (1/fn$ which, as can be determined from FIG. 9 and the equations for $V_C$ and $V_E$ expressed hereinbefore, is chosen together with the numerical fraction $K_2$ obtain or at least approximate the desired equaliation.

Figure 13:
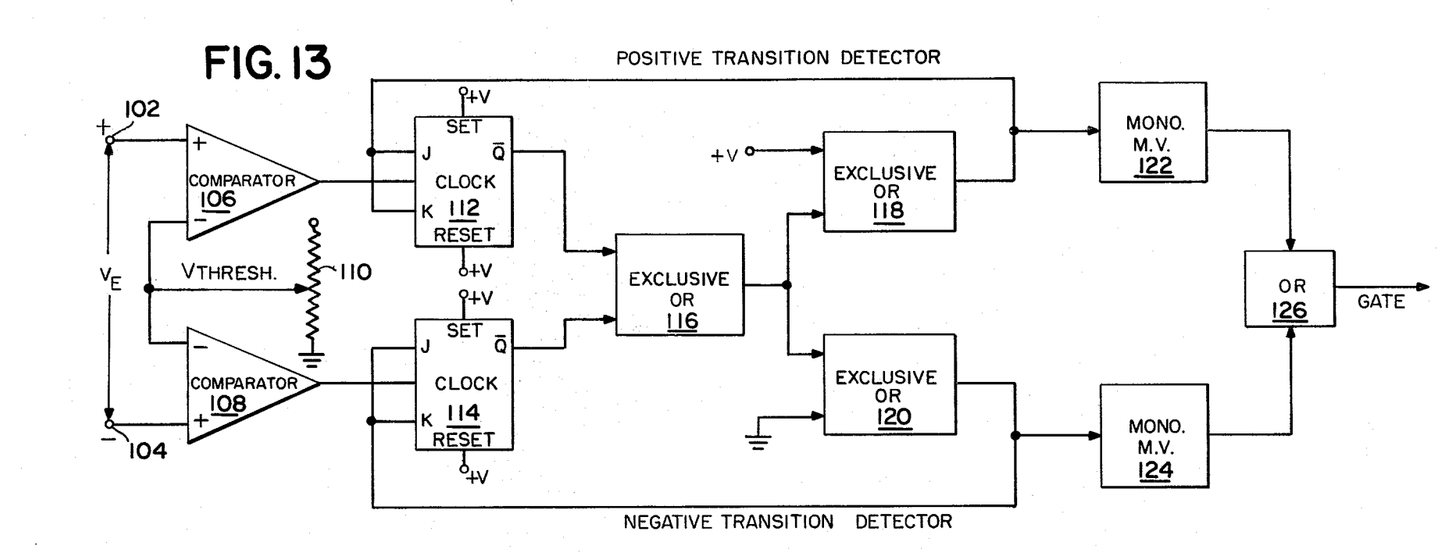
FIG. 13 is a block diagram of a preferred circuit implementation of the amplitude detection channel of the signal detector circuit shown in FIG. 2.

A more detailed description of the balanced gate generator circuit 48 used in the amplitude detection channel of FIG. 2 will no be given with reference to FIG. 13. The equalizer output signal $V_E$ is applied through automatic gain control amplifier 40 to the input terminals 102 and 104 of the gate generator. When a positive going pulse of signal $V_E$ is applied to terminal 102, exceeding a predetermined positive level as determined by the $V_{THRESH}$ setting of potentiometer 110, a high to low step signal is produced at the output of comparator 106 coupled to the clock input of flip flop 112 causing the signal level at the $\overline{Q}$ terminal thereof to go low. This low level signal feeds through exclusive OR 116 producing a high level signal at its output thereby driving the signal at the output of exclusive OR 118 low and the signal at the output of exclusive OR 120 high. This low going signal at the output of exclusive OR 118 triggers monostable multivibrator 122 producing a pulse of predetermined duration at the output thereof which feeds through OR element 126 as a gate pulse for application to the AND gate 50 (FIG. 2) along with pulses supplied from the peak detection channel. The low level signal at the output of exclusive OR 118 is also fed back to the J and K inputs of flip flop 112 thereby precluding generation of another gate pulse in response to any immediately following positive going pulse appearing at input terminal 102. However, when a negative going pulse of signal $V_E$ is applied to input terminal 104 exceeding a predetermined negative level as determined by the $V_{THRESH}$ setting of potentiometer 110 a high-to-low step signal is produced at the output of comparator 108 coupled to the clock input of flip flop 114 causing the signal at its Q to go low. This low level signal feeds through exclusive OR 116 producing a low level signal at its output thereby driving the signal at the output of exclusive OR 120 low and the signal at the output of exclusive OR 118 high. The low going signal at the output of exclusive OR 120 triggers monostable multivibrator 124 producing a pulse of predetermined duration at the output thereof which feeds through OR element 126 providing another gate pulse. This low going signal at the output of exclusive OR 120 is also fed back to the J and K inputs of flip flop 114 thereby precluding generation of another gate pulse in response to any immediately following negative going pulse appearing at input terminal 104. Now, howevwr, by virtue of the high level signal applied to the J and K terminals of flip flop 112 from exclusive OR 118, the circuit can respond to a positive going pulse of required amplitude at input terminal 102 after which it will again be able to respond to another negative going pulse of required amplitude appearing at input terminal 104. Thus, the circuits acts in toggling fashion responding to alternate positive and negative input pulses corresponding to alternate positive and negative going transitions on the magnetic storage medium.

While the invention has been described specifically with respect to cosine-fourth-power spectral shaping which is considered optimum, it will be appreciated that the invention is not intended to be so limited and clearly encompasses functions approximating the cosine-fourth-power function insofar as they provide the characteristics desired for the signal applied to the peak detection and amplitude detection channels. Moreover, the invention can be utilized in either the peak detection channel or the amplitude detection alone although it is particularly preferred for the amplitude detection channel. In fact, where the invention is incorporated only in the amplitude channel, it will serve to provide even-function spectral shaping therein as compared to the odd-function spectrum shaping provided by the differentiator in the peak detection channel.

Figure 14:
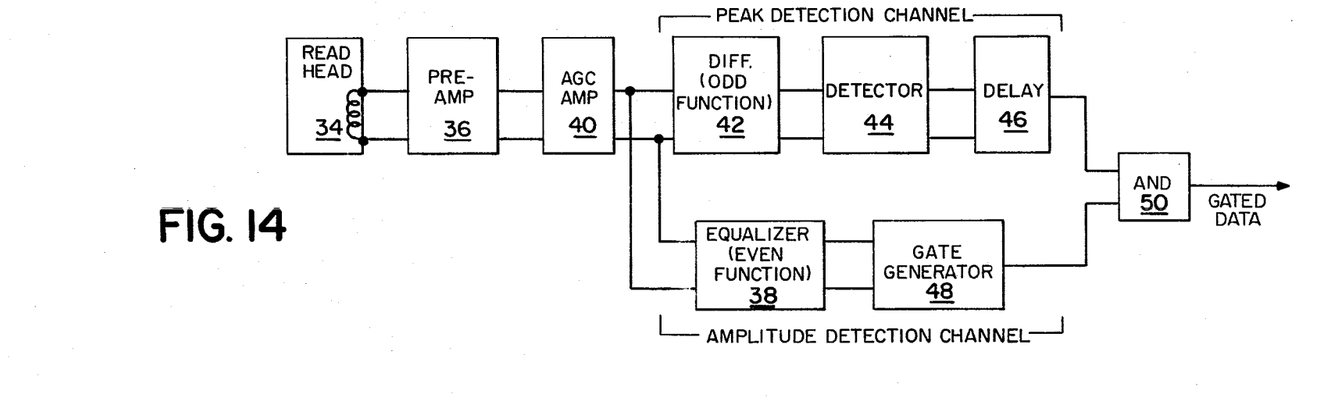
FIG. 14 is a block diagram of an alternative embodiment of the invention.

An alternate embodiment of the invention in which the equalizer is included only in the amplitude detection channel is shown in FIG. 14 which will be recognized to be similar to the embodiment of FIG. 2 except for the location of the equalizer and in which like elements are identified by the same numeral designation.

While the invention has been described with reference to specific embodiments, it will be apparent that improvements and modifications may be made within the purview of the invention without departing from the true spirit and scope thereof as defined in the appended claims.

We claim:

1. A dual channel signal detector circuit for detecting data in an input signal applied to said circuit, comprising:
   equalizer means for transforming a variable peak amplitude input signal having data representative pulse peaks into a substantially constant peak amplitude output signal having even-symmetric data representative pulses each corresponding to a respective pulse of the input signal, where each data representative pulse is narrowed in time relative to the corresponding input pulse and substantially flat at the baseline on each side beyond the baseline touching points and has an amplitude spectrum contained with a limited frequency range,
   peak detection channel means coupled to said equalization means for producing a data pulse indicative of the peak of each data rperesentative pulse of the output signal of said equalizer means,
   amplitude detection channel means coupled to said equalization means for producing a gating pulse corresponding to each data representative pulse of the output signal of said equalizer means, and
   means coupled to receive the data pulses and getting pulses and respond to each data pulse occurring in time coincidence with a gating pulse for gating the data pulses to an output terminal of said circuit.

2. The circuit of claim 1 wherein the equalizer means transforms the input signal such that each data representative pulse has an even-function amplitude spectrum.

3. The circuit of claim 1 wherein the equalizer means transforms the input signal such that each data representative pulse has a cosine-power amplitude spectrum.

4. The circuit of claim 1 wherein the equalizer means transforms the input signal such that each data representative pulse has a substantially cosine-fourth-power amplitude spectrum with a cutoff frequency $fc$ equal $1/T$ and zero baseline touching points at $3T/2$ on opposite sides of the pulse leak located at T equal zero.

5. The circuit of claim 1 wherein the amplitude detection channel means produces a gating pulse only in response to each data representative pulse exceeding a predetermined amplitude threshold.

6. The circuit of claim 5 wherein the equalizer means transforms the input signal such that each data representative pulse has an even-function amplitude spectrum.

7. The circuit of claim 5 wherein the equalizer means transforms the input signal such that each data representative pulse has a cosine-power amplitude spectrum.

8. The circuit of claim 5 wherein the equalizer means transforms the input signal such that each data representative pulse has a substantially cosine-fourth-power amplitude spectrum with a cutoff frequency $fc$ equal $1/T$ and zero baseline touching points at $3T/2$ on opposite sides of the pulse peak located at T equal zero.

9. The circuit of claim 5 wherein the amplitude detection channel means is so constructed and arranged as to respond only to alternate positive and negative data representative pulses exceeding the predetermined amplitude threshold.

10. The circuit of claim 9 wherein the equalizer means transforms the input signal such that each data representative pulse has a substantially cosine-fourth-power amplitude spectrum with a cutoff frequency $fc$ equal to $1/T$ and zero baseline touching points at $3T/2$ on opposite sides of the pulse peak located at T equal zero.

11. The circuit of claim 10 wherein the amplitude detection channel means comprises a balanced gate generator circuit having a pair of input terminals coupled to receive the output signal of said equalization means, comparator means connected to said pair of input terminals for responding to pulses of the output signal of said equalization means exceeding the predetermined amplitude threshold to produce the gating pulses, and inhibiting means coupled to said comparator means for inhibiting response thereof to successive pulses of the output signal of said equalization means having the same polarity.

12. The circuit of claim 11 wherein the equalizer means comprises a balanced filter having first and second input terminals coupled to receive the variable peak amplitude input signal, delay line means having a predetermined time delay terminated in an open circuit and coupled to said first and second input terminals, first signal summing means for summing the signal at said first input terminal with a signal derived from the output of said delay line means, and second summing means for summing the signal at said second input terminal with a signal derived from the output of said delay line means.

13. A dual channel signal detector circuit for detecting data in an input signal applied to said circuit, comprising:
   equalizer means for transforming a variable peak amplitude input signal having data representative pulse peaks into a substantially constant peek amplitude output signal having evensymmetric data representative pulses each corresponding to a respective pulse of the input signal, where each data representative pulse is narrowed in time relative to the corresponding input pulse and substantially flat at the baseline on each side beyond the baseline touching points and has an amplitude spectrum contained within a limited frequency range, peak detection channel means coupled to receive the input signal for producing a data pulse indicative of each data representative pulse peak, amplitude detection channel means coupled to receive the output signal of said equalization means for producing a gating pulse corresponding to each data representative pulse, and means coupled to receive the data pulses and gating pulses and respond to each data pulse occurring in time coincidence with a gating pulse for gating the data pulses to an output terminal of said circuit.

14. The circuit of claim 13 wherein the amplitude detection channel means produces a gating pulse only in response to each data representative pulse exceeding a predetermined amplitude threshold.

15. The circuit of claim 14 wherein the equalizer means transforms the input signal such that each data representative pulse has an even-function amplitude spectrum.

16. The circuit of claim 14 wherein the equalizer means transforms the input signal such that each data representative pulse has a cosine-power amplitude spectrum.

17. The circuit of claim 14 wherein the equalizer means transforms the input signal such that each data representative pulse has a substantially cosine-fourth-power amplitude spectrum with a cutoff frequency $f_c$ equal to $1/T$ and zero baseline touching points at $3T/2$ on opposite sides of the pulse peak located at T equal zero.

18. The circuit of claim 14 wherein the amplitude detection channel means is so constructed and arranged as to respond only to alternate positive and negative data representative pulses exceeding the predetermined amplitude threshold.

19. The circuit of claim 18 wherein the equalizer means transforms the input signal such that each data representative pulse has a substantially cosine-fourth-power amplitude spectrum with a cutoff frequency $f_c$ equal to $1/T$ and zero baseline touching points at $3T/2$ on opposite sides of the pulse peak located at T equal zero.

20. The circuit of claim 19 wherein the amplitude detection channel means comprises a balanced gate generator circuit having a pair of input terminals coupled to receive the output signal of said equalization means, comparator means connected to said pair of input terminals for responding to pulses of the output signal of said equalization means exceeding the predetermined amplitude threshold to produce the gating pulses, and inhibiting means coupled to said comparator means for inhibiting response thereof to successive pulses of the output signal of said equalization means having the same polarity.

21. The circuit of claim 20 wherein the equalizer means comprises a balanced filter having first and second input terminals coupled to receive the variable peak amplitude input signal, delay line means having a predetermined time delay terminated in an open circuit and coupled to said first and second input terminals, first signal summing means for summing the signal at said first input terminal with a signal derived from the output of said delay line means, and second summing means for summing the signal at said second input terminal with a signal derived from the output of said delay line means.

* * * * *